(12) United States Patent
Bradbury

(10) Patent No.: US 6,249,064 B1
(45) Date of Patent: *Jun. 19, 2001

(54) MAGNETO-STRICTION MICROACTUATOR

(75) Inventor: Robert T. Bradbury, Oklahoma City, OK (US)

(73) Assignee: Seagate Technology LLC, Scotts Valley, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/303,205

(22) Filed: Apr. 30, 1999

Related U.S. Application Data
(60) Provisional application No. 60/088,081, filed on Jun. 5, 1998.

(51) Int. Cl.$^7$ ............................. H02K 7/06; H02K 41/06; H02K 33/00; G11B 5/48; G11B 5/55
(52) U.S. Cl. ................................. 310/22; 310/26; 310/29; 310/36; 360/294.3; 360/294.4
(58) Field of Search ..................................... 310/67 R, 20, 310/21, 22, 26, 29, 32, 33, 36, 37, 38, 15; 360/104, 106, 109, 113, 123, 294.3, 294.4, 294.1, 294.2, 294.5, 294.6, 294.7, 294

(56) References Cited

U.S. PATENT DOCUMENTS

| | | | | |
|---|---|---|---|---|
| 1,126,084 | * | 1/1915 | Reisbach ................. | 310/37 |
| 2,730,103 | * | 1/1956 | Mackta ................... | 128/305 |
| 3,014,165 | * | 12/1961 | Koke ..................... | 317/165 |
| 3,044,028 | * | 7/1962 | Harris .................... | 333/71 |
| 3,242,357 | * | 3/1966 | Guichard ................ | 310/37 |
| 3,679,921 | * | 7/1972 | Jank ..................... | 310/37 |
| 4,287,457 | * | 9/1981 | Takemura .............. | 318/133 |
| 4,404,523 | | 9/1983 | Hughes et al. ........ | 324/207 |
| 4,545,042 | * | 10/1985 | Fomin et al. ......... | 367/189 |
| 4,914,626 | | 4/1990 | Thiele ................. | 310/106 |
| 5,189,578 | | 2/1993 | Mori et al. ............ | 360/106 |
| 5,262,907 | | 11/1993 | Duffy et al. ........... | 360/77.05 |
| 5,303,105 | | 4/1994 | Jorgenson ............. | 310/106 |
| 5,307,226 | | 4/1994 | Brug et al. ............ | 360/113 |
| 5,344,117 | | 9/1994 | Trah et al. ............ | 251/11 |
| 5,418,418 | | 5/1995 | Hirano et al. ......... | 310/328 |
| 5,432,395 | * | 7/1995 | Grahn .................. | 310/328 |
| 5,461,272 | | 10/1995 | Matsumoto ........... | 310/309 |
| 5,477,097 | | 12/1995 | Matsumoto ........... | 310/309 |
| 5,489,812 | | 2/1996 | Furuhata et al. ...... | 310/309 |
| 5,491,559 | * | 2/1996 | Buechler .............. | 358/299 |
| 5,493,156 | | 2/1996 | Okada ................ | 310/40 M |
| 5,521,778 | | 5/1996 | Boutaghou et al. ... | 360/106 |
| 5,657,188 | | 8/1997 | Jurgenson et al. .... | 360/106 |
| 5,706,150 | * | 1/1998 | Williams .............. | 360/106 |
| 5,709,802 | | 1/1998 | Furuhata et al. ...... | 216/2 |
| 5,711,063 | | 1/1998 | Budde et al. ......... | 29/603.06 |
| 5,739,601 | | 4/1998 | Tsodikov .............. | 310/26 |
| 5,745,319 | * | 4/1998 | Takekado et al. ..... | 360/78.05 |
| 5,796,558 | | 8/1998 | Hanrahan et al. ..... | 360/106 |
| 5,863,024 | | 1/1999 | Blind et al. ........... | 251/129.01 |
| 5,867,347 | | 2/1999 | Knight et al. ......... | 360/104 |
| 5,881,198 | | 3/1999 | Haake .................. | 385/136 |
| 5,903,085 | * | 5/1999 | Karam ................. | 310/328 |
| 6,002,549 | * | 12/1999 | Berman et al. ....... | 360/104 |

\* cited by examiner

Primary Examiner—Nestor Ramirez
Assistant Examiner—Dang Dinh Le
(74) Attorney, Agent, or Firm—Crowe & Dunlevy

(57) ABSTRACT

Apparatus and method for providing microactuator positional control in a disc drive having a rotatable disc on which a plurality of tracks are defined and an actuator assembly which supports a head adjacent the tracks. An actuator motor is used to provide primary positioning of the head through the controlled application of current to a coil of the actuator motor. A microactuator, opposite the actuator motor coil, has a pair of microactuator coils wound about respective magneto-striction beams so that, in response to drive currents passed through the microactuator coils, a selected one of the magneto-striction beams increases in length and the remaining magneto-striction beam decreases in length. The magneto-striction beams act upon a pivot assembly coupled to the head to displace the head to a final desired position adjacent the disc.

6 Claims, 4 Drawing Sheets

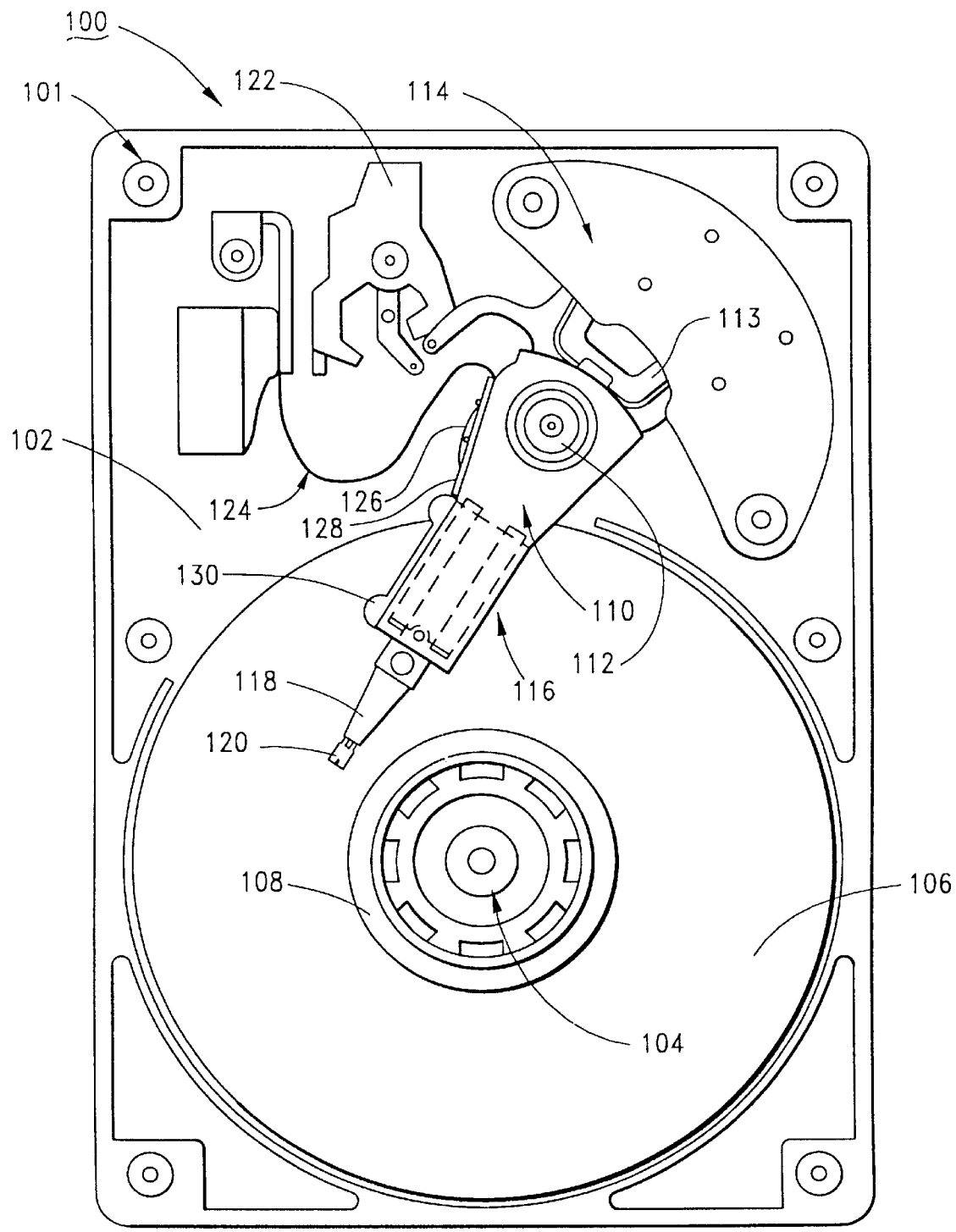
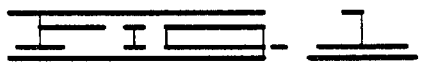

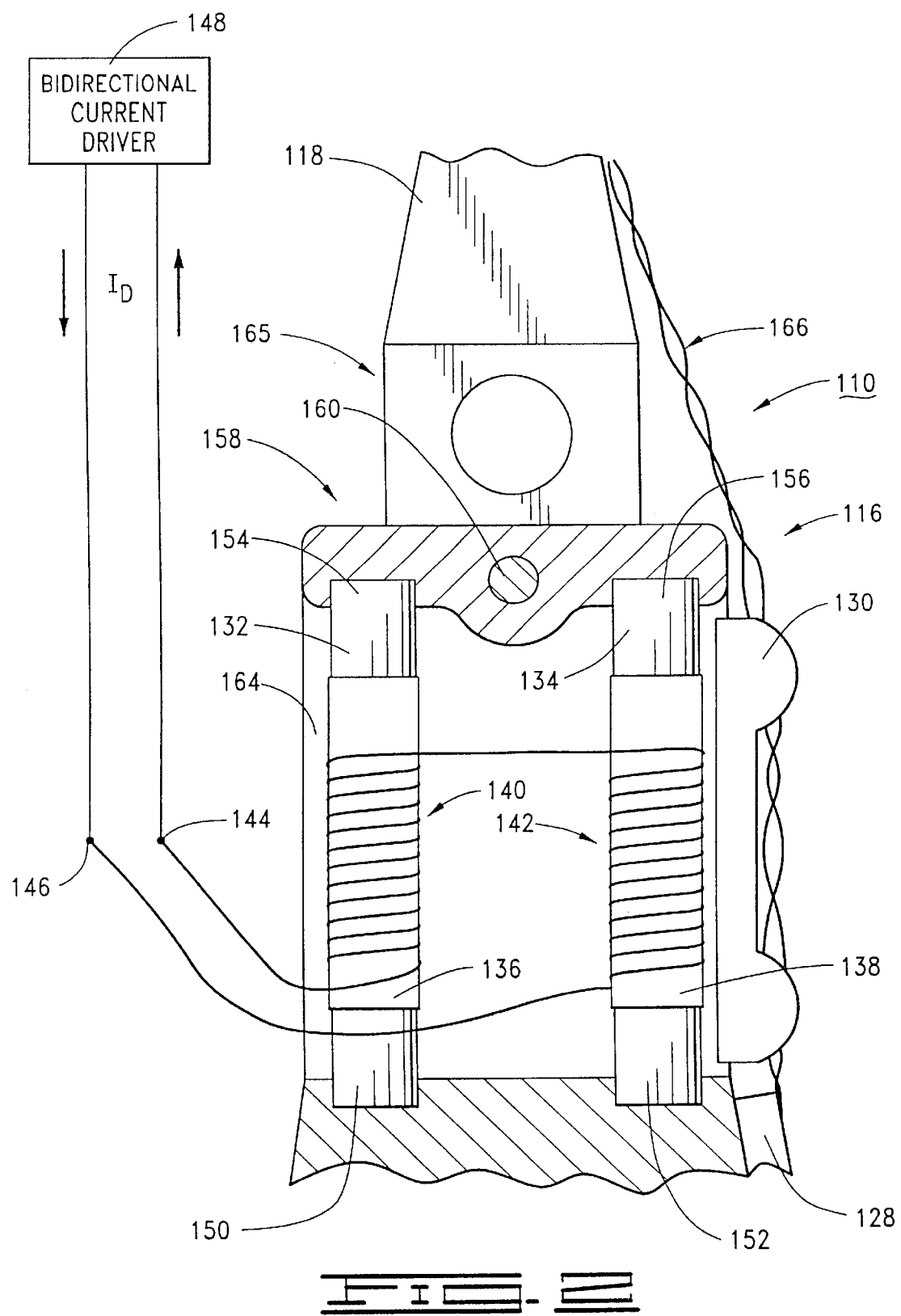

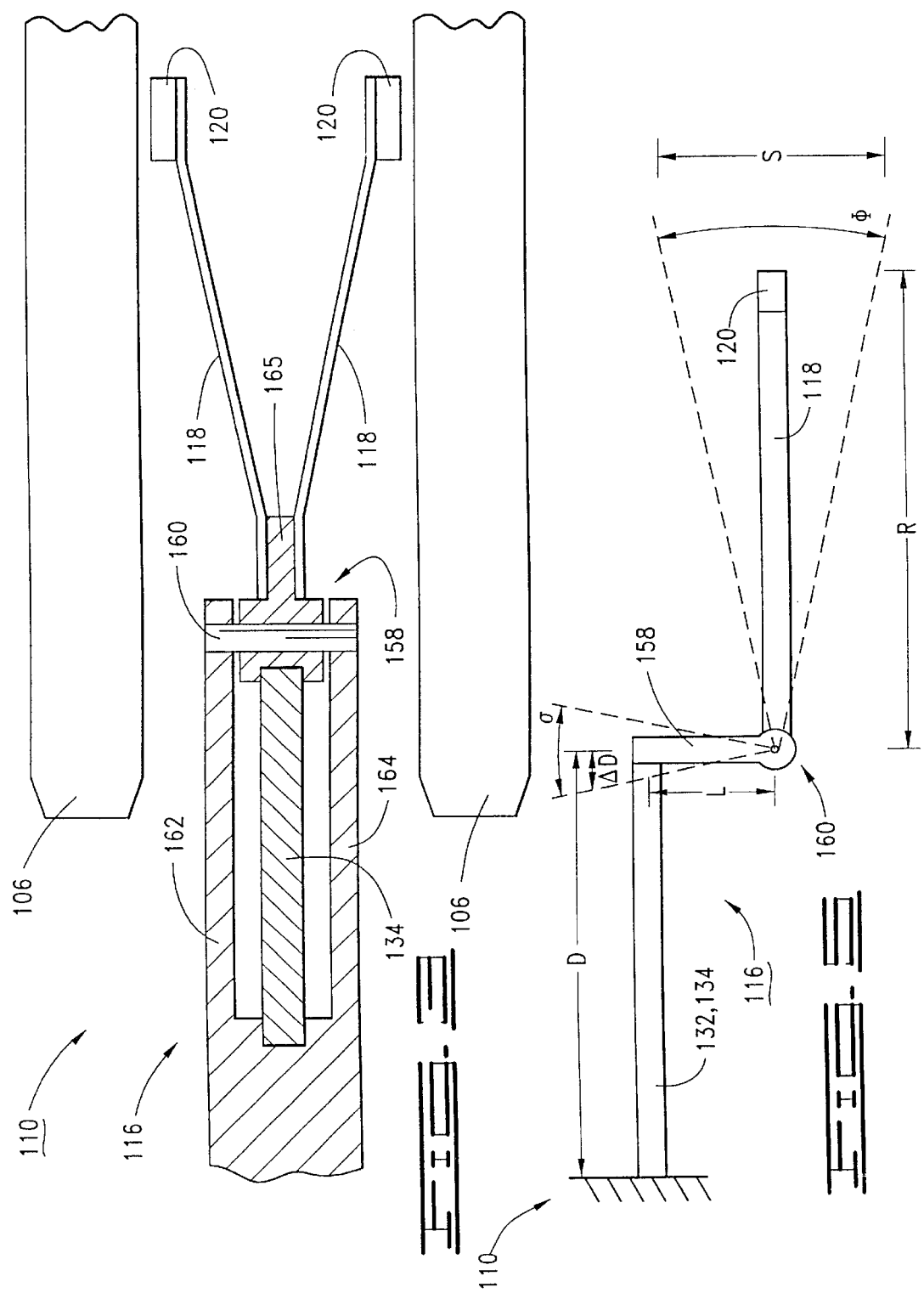

MAGNETO-STRICTION MICROACTUATOR

RELATED APPLICATIONS

This application claims the benefit of Provisional Application No. 60/088,081 entitled MICRO ACTUATOR METHOD OF MOVING HEAD ARM BY MAGNETO-STRICTION, filed Jun. 5, 1998.

FIELD OF THE INVENTION

This invention relates generally to the field of disc drive storage devices, and more particularly, but not by way of limitation, to improving head positioning resolution in a disc drive through the use of a microactuator employing magneto-striction.

BACKGROUND OF THE INVENTION

Disc drives are digital data storage devices which enable users of computer systems to store and retrieve large amounts of data in a fast and efficient manner. Data are magnetically stored using read/write heads which access recording surfaces of a plurality of rotatable discs.

The heads are suspended by an actuator assembly mounted adjacent the discs. The actuator assembly is pivoted about a cartridge bearing assembly by an actuator motor, such as a voice coil motor (VCM) in which a coil attached to the actuator assembly opposite the heads is immersed in a magnetic circuit comprising a pair of permanent magnets. The controlled application of current causes the coil to move relative to the magnets, resulting in the sweeping of the heads across the disc surfaces.

A plurality of tracks are defined on the disc surfaces using servo information written to the discs during disc drive manufacturing. The disc drive includes a digital servo system such as disclosed in U.S. Pat. No. 5,262,907 issued Nov. 16, 1993 to Duffy et al., which applies the current to the coil in response to the servo information read by the heads in order to selectively position the heads during disc drive operation.

A continuing trend in the industry is to provide successive generations of disc drives with ever increasing data capacities, using essentially the same available disc surface area. Accordingly, efforts continue to be made to facilitate increases in data storage areal densities, including increases in the number of tracks per unit of disc radial distance. Because of limitations associated with the use of VCMs to provide head positional control, some disc drive manufacturers are moving to implement so-called "microactuators" to facilitate further improvements in track densities. As will be recognized, microactuators are secondary motors suspended by the actuator assemblies at positions adjacent each head to provide fine (secondary) positional adjustment of each head over and above the coarse (primary) positional adjustment provided by the VCM.

A variety of microactuator constructions has been proposed in the art. One such construction involves the use of a coil such as exemplified by U.S. Pat. No. 5,657,188 issued Aug. 12, 1997 to Jurgenson et al., which discloses a disc drive with a suspension having a rigid load beam and a flexure supporting a read/write head. A microactuator, disposed at a distal end of the load beam, moves the flexure about a tracking axis and includes a moving pole member mounted to the flexure, a stationary pole member mounted to the load beam, and coils disposed around the stationary pole member.

Another microactuator construction type involves the use of piezoelectric transducers such as exemplified by U.S. Pat. No. 5,521,778 issued May 28, 1996 to Boutaghou et al. and U.S. Pat. No. 5,189,578 issued Feb. 23, 1993 to Mori et al. In the U.S. 5,521,778 reference, an actuator assembly is mountable for pivotal movement about a pivot axis and has a coil of a primary positioning actuator motor, an actuator arm extending from the pivot axis opposite the coil, a load beam extending from the actuator arm and a microactuator between the actuator arm and the load beam. The microactuator, utilizing piezoelectric transducers arranged on a ring/hub structure, operates to provide fine positional control of the head which is disposed at a distal end of the load beam. Similarly, the U.S. Pat. No. 5,189,578 reference discloses a disc drive having an actuator assembly with a voice coil motor to provide coarse positional control and a microactuator in an arm of the actuator assembly which provides fine positional control of the head. The microactuator includes the use of a piezoelectric element and a resilient mechanism to limit deflection caused by the piezoelectric element, with the resilient mechanism comprising a pair of leaf springs on each side of the piezoelectric element.

A suspension assembly formed from silicon using integrated circuit fabrication techniques and accommodating the use of a microactuator has also been disclosed in U.S. Pat. No. 5,711,063 issued Jan. 27, 1998 to Budde et al. This reference discloses a reduced thickness magnetic head suspension disposed at a distal end of an actuator assembly, the suspension formed from an etched silicon structure and including a microactuator disposed on a load beam supporting the head. The reference further suggests forming at least a portion of the requisite electrical connection paths for the head and the microactuator using well known semiconductor etching techniques.

While these and other prior art microactuator configurations may be found operative, there remains a continual need for improvements in the art to achieve microactuator positional control in an efficient and easily implementable manner. It is to such improvements that the present invention is directed.

SUMMARY OF THE INVENTION

The present invention an apparatus and method for providing microactuator positional control in a disc drive.

As exemplified by presently preferred embodiments, a disc drive has a rotatable disc on which a plurality of tracks are defined and an actuator assembly which supports a head adjacent the tracks.

An actuator motor, such as a voice coil motor (VCM), is used to provide primary positioning of the head through the controlled application of current to a coil of the actuator motor.

A microactuator, opposite the actuator motor coil, is used to provide secondary positioning of the head. The microactuator has a pair of microactuator coils wound about respective beams formed from a magneto-striction material. As will be recognized by those skilled in the art, magneto-striction is a characteristic whereby a ferromagnetic material body undergoes a change in linear dimension caused by a change in its state of magnetization.

In response to drive currents passed through the microactuator coils, a selected one of the magneto-striction beams increases in length and the remaining magneto-striction beam decreases in length. The magneto-striction beams act upon a pivot assembly coupled to the head to position the head adjacent a desired track on the disc. The coils can be serially connected and wound in opposite directions so that a single drive current is passed through both coils;

alternatively, the coils can be separately configured so that individual drive currents are applied to each coil.

These and various other features and advantages which characterize the present invention will be apparent from a reading of the following detailed description and a review of the associated drawings.

BRIEF DESCRIPTION OF THE DRAWINGS

FIG. 1 shows a top plan view of a disc drive constructed in accordance with preferred embodiments of the present invention, the disc drive incorporating the use of magneto-striction microactuator assemblies to provide fine positional control of heads of the disc drive.

FIG. 2 provides a plan, partial cross-sectional view of one of the microactuator assemblies of FIG. 1.

FIG. 3 provides an elevational, partial cross-sectional view of the microactuator assembly of FIG. 3.

FIG. 5 provides a simplified mechanical diagram of the microactuator assembly of FIGS. 2 and 3.

DETAILED DESCRIPTION

Figure 4:
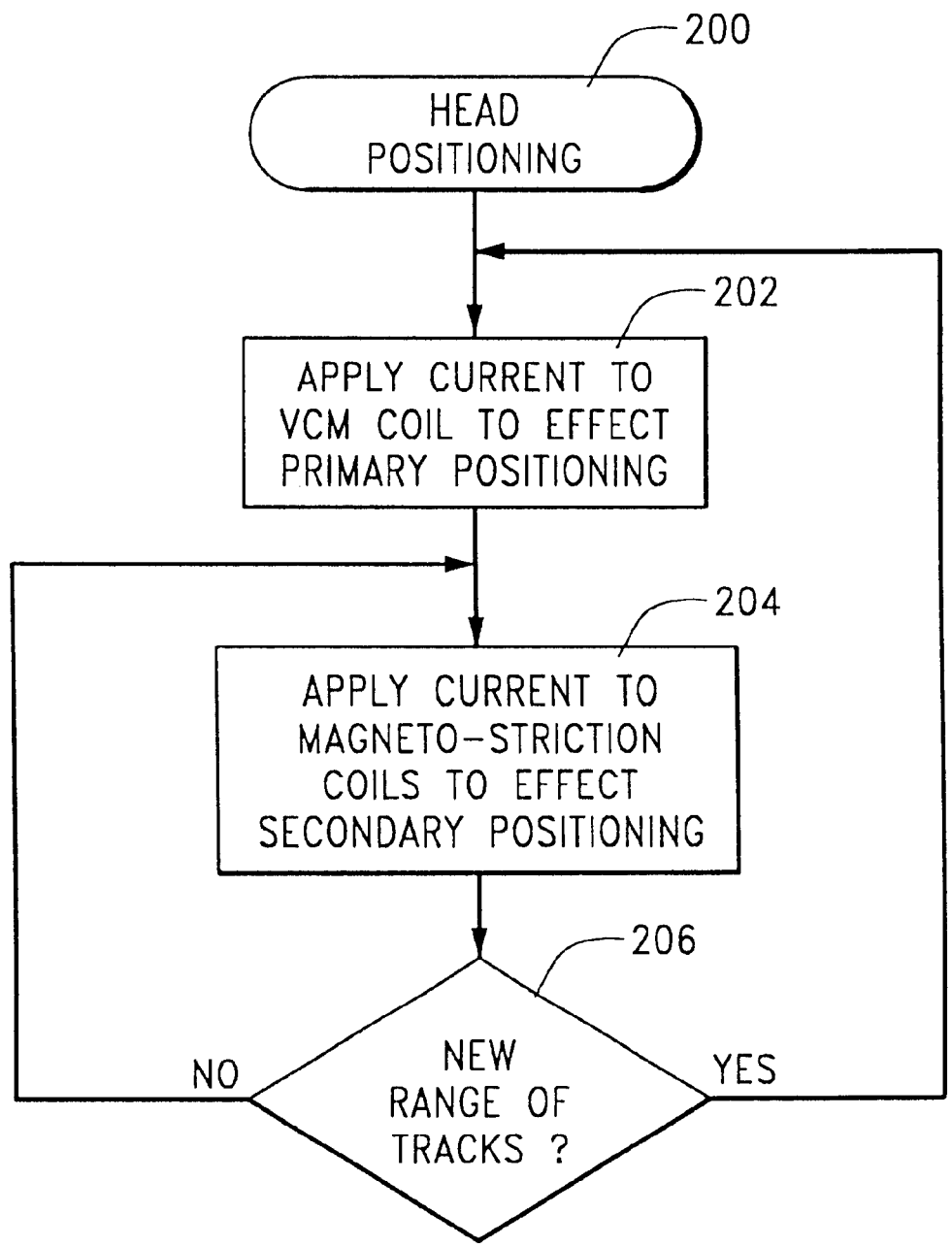
FIG. 4 is a flow chart for a HEAD POSITIONING routine, illustrating the general manner in which head positional control is preferably achieved with the microactuator assembly of FIGS. 2 and 3.

Referring now to the drawings, FIG. 1 shows a top plan view of a disc drive 100 constructed in accordance with preferred embodiments of the present invention. The disc drive 100 includes a head-disc assembly (HDA) 101 and a printed wiring assembly (PWA) which is mounted to the underside of the HDA, and thus not visible in FIG. 1.

A top cover, omitted from FIG. 1 to reveal interior portions of the HDA 101, mates with a base deck 102 of the HDA 101 in order to provide an enclosed housing for the HDA 101. A spindle motor (generally designated at 104) is supported by the base deck 102 and rotates a plurality of discs 106 at a constant high speed. A disc clamp 108 secures the discs 106 to the spindle motor 104.

The discs 106 include recording surfaces (not separately designated) having a plurality of tracks to which user data are written by way of a rotary actuator 110. The actuator 110 rotates about a cartridge bearing assembly 112 in response to the application of current to a coil (113, a portion of which is visible in FIG. 1) of a voice coil motor (VCM) 114 to provide coarse (primary) positional control.

A plurality of magneto-striction microactuators extend from the actuator, with the topmost microactuator shown in broken line at 116. The microactuators 116 support flexible suspension assemblies 118, which in turn support heads 120 over the tracks of the discs 106 by air bearings established by air currents set up by the high speed rotation of the discs 106. As discussed below, the microactuator assemblies 116 provide fine (secondary) positional control of the heads 120.

FIG. 1 further shows a latch assembly 122 which secures the actuator 110 when the disc drive 100 is deactivated, allowing the heads 120 to come to rest upon texturized landing zones (not designated) located at the inner radii of the discs 106. A flex circuit assembly 124 facilitates electrical communication between the actuator 110 and the disc drive PWA, and includes a preamplifier/driver 126 encapsulated in epoxy and mounted to a flex PWA 128 which in turn is mounted to the actuator 110. A wire guide 130 is mounted to the actuator 110 to support head wires which extend from solder pads on the flex PWA 128 and are routed along the actuator 110 out to the individual heads 120. The flex PWA 128 can further support microactuator drive circuitry, as desired.

FIGS. 2 and 3 illustrate a preferred configuration of a selected one of the microactuators 116, with FIG. 2 showing a plan, partial cross-sectional view and FIG. 3 showing an elevational, partial cross-sectional view. The selected microactuator 116 comprises a pair of actuator beams 132, 134, each preferably comprising a cylindrically shaped member fabricated from nickel or a nickel based alloy having a suitable, nonzero magneto-striction coefficient. As will be recognized, magneto-striction is a characteristic whereby a ferromagnetic material body undergoes a change in linear dimension caused by a change in its state of magnetization.

The beams 132, 134 are each coated with a corresponding electrically insulating layer 136, 138 to electrically insulate coils 140, 142 formed from a common conductor wound as shown. Terminal ends of the conductor, indicated at 144, 146, are electrically connected to a bidirectional current driver 148 which selectively applies a bidirectional drive current $I_D$ thereto, establishing magnetic fields in the coils 140, 142 of opposite polarity. The beams 132, 134 react to the magnetic fields by respectively extending and retracting in length, depending upon the direction of the currents passing through the coils 140, 142. In an alternative embodiment, the coils 140, 142 are not serially connected, but instead are separately connected to the current driver 148 with each receiving individual drive currents therefrom.

First ends 150, 152 of the beams 132, 134 are rigidly affixed to a base surface (not numerically designated) of the actuator assembly 110 as shown and second ends 154, 156 of the beams 132, 134 are affixed to a pivot assembly 158 which pivots about a pivot shaft 160. The pivot shaft 160 is supported by support flanges 162. 164 which extend from the actuator assembly 110 as shown (it will be noted that the "top" support flange 162 has been omitted from FIG. 2 for clarity of illustration).

The pivot assembly 158 includes a mounting flange 165 to which the corresponding flexures 118 are secured via swaging (as shown) or other suitable process. Thus, through the controlled application of drive current $I_D$ to the microactuator 116, the pivot assembly 158 rotates about the pivot shaft 160 and the heads 120 are moved in a fine control mode, with the heads 120 being displaced an amount determined in relation to the magnitude and polarity of the drive current $I_D$.

The preferred mounting of two flexures 118 to the mounting flange 164 for intermediate actuator arms advantageously reduces the total number of microactuators 116 required for the actuator 110. For reference, one set of head wires is denoted at 166 to illustrate the general manner in which the head wires are preferably routed along the wire guide 130 and out to the heads 120. The head wires 166 are secured to the flexures in a conventional manner, allowing sufficient slack to allow pivotal movement of the heads 120. The wire guide 130 can be preferably used to add additional structural rigidity to adjacent microactuators 116, as desired. It will be noted that the wire guide 130, as well as the coil 142, have been omitted from FIG. 3 for clarity of illustration.

Overall head positional control is accordingly carried out as generally set forth by a HEAD POSITIONING routine 200 of FIG. 4. Primary positioning current is first applied to the coil 113 of the VCM 114 by a servo circuit of the disc drive (not shown), as indicated by step 202. This serves to place the head 120 adjacent a selected range of tracks on the disc 106, with the selected range of tracks including a particular track to be accessed by the head 120.

At step 204, secondary positioning current is next applied to the associated microactuator 116 to bring the head 120 into alignment with the particular track to be accessed, as discussed above, after which reading and/or writing operations are carried out in a conventional manner.

As indicated by decision step 206, when a new track on the associated disc surface is to be accessed, a determination is made whether the new destination track is disposed within the range of tracks brought proximate the actuator 110 by the operation of step 202; if so, the routine returns to step 204 and appropriate secondary positioning current is again applied to the microactuator 116 to position the head 120 adjacent the new destination track. On the other hand, if the new track is located elsewhere on the disc surface, the routine returns to step 202, so that primary positioning current is applied to the VCM coil 113 to bring the head 120 adjacent a new range of tracks containing the new destination track, after which the new destination track is individually accessed at step 204.

Detailed operation of the microactuator 116 can be further understood with reference to FIG. 5, which provides a simplified diagram of the microactuator of FIGS. 1–3. Selecting the value S to represent the displacement of the head 120 and using the principle of similar triangles, $$S = \frac{R}{L}(\Delta D) \tag{1}$$

with R/L being a multiplication of the magneto-striction displacement $\Delta D$ of the beams 132, 134. The beams 132, 134 exert respective pushing (elongation) and pulling (retraction) forces on the pivot assembly 158 (which operates as a lever having length L). Thus, there are two forces working to overcome the opposing forces acting upon the flexure 118 (having length R).

Assuming that the resultant of all opposing forces, $F_O$, act at the head 120, then an opposing torque $\tau_O$, can be stated as:

$$\tau_O = F_O(R) \tag{2}$$

which exists about the flexure 118. This torque is transmitted to the beams 132, 134 via the pivot assembly 158. Thus, the beams 132, 134 should exert a force $F_B$ as follows:

$$F_B = (F_O)\frac{R}{L} \tag{3}$$

in order to overcome the opposing forces $F_O$; indeed, the force $F_B$ is greater than the opposing forces $F_O$ by a factor R/L.

From the foregoing discussion it will be recognized that the present invention, as embodied herein, provides several advantages over the prior art, in that the microactuator 116 is easily controlled through the application of the bidirectional drive current $I_D$. Relatively small angular deflections of the pivot assembly 158 by the beams 132, 134 result in movement of the heads 120 in relation to the ratio of the lever arm characteristics L of the pivot assembly 158 and the length of the flexures 118. Using the microactuators 116 to provide fine positional control of two heads between adjacent discs further reduces the number of microactuators 116 and the complexity of the associated control circuitry.

In view of the foregoing discussion, it will now be understood that the present invention provides an apparatus and method for providing microactuator positional control in a disc drive.

As exemplified by presently preferred embodiments, a disc drive 100 has a rotatable disc 106 on which a plurality of tracks are defined and an actuator assembly 110 which supports a head 120 adjacent the tracks.

An actuator motor 114, such as a voice coil motor (VCM), is used to provide primary positioning of the head through the controlled application of current to a coil 113 of the actuator motor.

A microactuator 116, opposite the actuator motor coil, has a pair of microactuator coils 140, 142 wound about respective magneto-striction beams 132, 134 so that, in response to drive currents passed through the microactuator coils, a selected one of the magneto-striction beams increases in length and the remaining magneto-striction beam decreases in length. The magneto-striction beams act upon a pivot assembly 158 coupled to the head to provide secondary positioning of the head.

For purposes of the following claims, the term "magneto-striction" will be clearly understood, consistent with the foregoing discussion, to describe the characteristic of a ferromagnetic body to undergo a change in physical length in relation to the application of a magnetic field along the body.

It will be clear that the present invention is well adapted to attain the ends and advantages mentioned as well as those inherent therein. While a presently preferred embodiment has been described for purposes of this disclosure, numerous changes may be made which will readily suggest themselves to those skilled in the art and which are encompassed in the spirit of the invention disclosed and as defined in the appended claims.

What is claimed is:

1. A disc drive, comprising:
  a rotatable disc on which a plurality of tracks are defined; and
  an actuator assembly which supports a head adjacent the tracks, comprising:
    a coil of an actuator motor which provides primary positioning of the head through the controlled application of current to the actuator motor coil; and
    a microactuator, opposite the actuator motor coil, comprising a pair of microactuator coils wound about respective magneto-striction beams so that, in response to drive currents passed through the microactuator coils, a selected one of the magneto-striction beams increases in length and the remaining one of the magneto-striction beams decreases in length, wherein the microactuator further comprises a support flange which extends adjacent the magneto-striction beams and supports a pivot assembly rigidly affixed to the magneto-striction beams and the head so that the magneto-striction beams cooperate to concurrently induce a combined rotational force on the pivot assembly in a common rotational direction to rotate the pivot assembly about an axis and displace the head to a final desired position adjacent the disc.

2. The disc drive of claim 1, wherein the pair of microactuator coils are electrically connected in series so that a single drive current is passed through both coils.

3. The disc drive of claim 1, wherein the head and disc are respectively characterized as a first head and a first disc, wherein the disc drive further comprises a second head and a second disc, and wherein the microactuator is disposed between the first and second discs to simultaneously position the first and second heads.

4. A microactuator operationally configurable to position a control object, comprising:

a base surface;

a support flange having a proximal end affixed to the base surface and a distal end which projects from the base surface;

a pivot assembly mounted to the distal end of the support flange for pivotal movement about an axis and operationally configurable to support the control object a selected distance from the axis;

first and second beams extending adjacent the support flange each formed from ferromagnetic material with a nonzero magneto-striction coefficient and having a nominal physical length, a proximal end rigidly affixed to the base surface and a distal end rigidly affixed to the pivot assembly;

first and second coils respectively wound about the first and second beams configured to induce magnetic fields in the respective first and second beams to increase the physical length of the first beam and concurrently decrease the physical length of the second beam so that the magneto-striction beams concurrently induce a combined rotational force on the pivot assembly in a common rotational direction to rotate the pivot assembly and displace the control object to a final desired position.

5. The microactuator of claim 4 wherein the control object comprises a head of a disc drive.

6. The microactuator of claim 4, wherein the first and second coils are electrically connected in series so that a single drive current is passed through both coils.

* * * * *